(12) United States Patent
Voss et al.

(10) Patent No.: US 6,750,646 B1
(45) Date of Patent: Jun. 15, 2004

(54) APPARATUS FOR ENVIRONMENTAL TESTING OF A DEVICE IN SITU, AND METHOD THEREOF

(75) Inventors: Charles James Voss, Gardnerville, NV (US); Mark Richard Stanford, San Jose, CA (US)

(73) Assignee: nVidia Corporation, Santa Clara, CA (US)

( * ) Notice: Subject to any disclaimer, the term of this patent is extended or adjusted under 35 U.S.C. 154(b) by 0 days.

(21) Appl. No.: 10/264,585

(22) Filed: Oct. 4, 2002

(51) Int. Cl.[7] .............................................. G01R 31/02
(52) U.S. Cl. ..................... 324/158.1; 324/760
(58) Field of Search ................................ 324/760, 765, 324/158.1, 763, 754, 73.1

(56) References Cited

U.S. PATENT DOCUMENTS

| | | | | |
|---|---|---|---|---|
| 5,880,592 A | * | 3/1999 | Sharpes et al. | ............. 324/760 |
| 5,966,021 A | * | 10/1999 | Eliashberg et al. | ......... 324/760 |
| 6,057,698 A | * | 5/2000 | Heo et al. | ................... 324/765 |
| 6,392,432 B1 | * | 5/2002 | Jaimsomporn et al. | ..... 324/760 |
| 6,472,895 B2 | * | 10/2002 | Jaimsomporn et al. | ..... 324/760 |

* cited by examiner

*Primary Examiner*—Ernest Karlsen
*Assistant Examiner*—Tung X. Nguyen (57) ABSTRACT

An apparatus for environmental testing of a device under test (DUT), such as a printed circuit board. The apparatus generally includes a chamber for environmentally isolating the DUT with the DUT in situ and functional on another device (e.g., a motherboard). The DUT can be subjected to an environmental test condition inside the chamber while the other device is isolated from the environmental test condition. The chamber may have a connector for coupling the other device and the DUT, such that the DUT and the other device are in communication although in isolated environments.

34 Claims, 6 Drawing Sheets

```
┌─────────────────────────────────────────┐
│ MONITOR ENVIRONMENTAL TEST CONDITIONS(S) IN │
│   A CHAMBER ENCLOSING A DEVICE UNDER TEST   │
│                   510                       │
└─────────────────────────────────────────┘
                    │
                    ▼
┌─────────────────────────────────────────┐
│  CONTROL A REGULATING ASSEMBLY TO PRODUCE   │
│  AND MAINTAIN THE ENVIRONMENTAL TEST        │
│                CONDITION                    │
│                   520                       │
└─────────────────────────────────────────┘
```

FIGURE 5

APPARATUS FOR ENVIRONMENTAL TESTING OF A DEVICE IN SITU, AND METHOD THEREOF

FIELD OF THE INVENTION

Embodiments of the present invention relate to an apparatus and method for environmentally testing a device in situ. More specifically, embodiments of the present invention relate to an apparatus and method for environmentally testing a printed circuit board coupled to a motherboard.

BACKGROUND ART

Before devices are produced en masse and offered for public use, they generally undergo different types and degrees of testing. One type of testing that may be performed is environmental testing or environmental qualification. In environmental testing, the device is exposed to different conditions to determine how the device will perform under those conditions. Typically, the device is exposed to conditions more extreme than those the device will actually experience during normal operation.

Electronic devices such as printed circuit boards used in computer systems may undergo environmental testing for temperatures outside of the expected range of normal operating temperatures. Conceivably, a printed circuit board could be placed in an oven and subjected to high and low temperature extremes, then placed into a computer system to determine if the printed circuit board remains functional. However, such a test procedure does not provide information regarding how the printed circuit board performs while actually subjected to the temperature extremes.

Therefore, it is desirable to environmentally test the printed circuit board with the board in place and functional on a motherboard. Generally speaking, according to prior art test procedures, the printed circuit board is installed on the motherboard along with other components needed to make the motherboard/printed circuit board combination functional, in essence constituting a rudimentary computer system. The rudimentary computer system is placed inside a test chamber such as an oven or refrigerator, which can be heated and/or cooled as needed for the environmental testing. Different operations and functions that utilize the printed circuit board can then be performed, and information characterizing the performance of the printed circuit board under the environmental test conditions can be gathered and analyzed. At some point, due to either the extreme operating conditions or the prolonged exposure to those conditions, the rudimentary computer system may cease to function properly.

Prior art procedures for environmental testing of printed circuit boards suffer from a number of disadvantages. One disadvantage is highlighted by the above discussion. That is, for some reason, the rudimentary computer system may cease to function; however, without further investigation, it is not possible to determine if the device under test (e.g., the printed circuit board) failed, or if some other component (also subjected to the test environment) of the rudimentary computer system failed. The motherboard itself typically includes a number of components, any of which may have failed during the environmental testing. Consequently, it may be necessary to install the printed circuit board in another computer system to determine whether or not the board is still functional. If the printed circuit board is functional after the test, this would indicate that another component had failed. This may render the environmental test as inconclusive because, for example, the other component may have failed before the testing of the printed circuit board was completed. The testing then needs to begin anew, generally with all new components.

Therefore, another disadvantage of the prior art is that quantities of other components are consumed during the environmental testing. As mentioned, components other than the device under test may fail during testing. Even assuming that this is not the case, the components used in a test are likely unusable for subsequent tests. The amount of life remaining in previously used components is unknown. Should there be a failure during another environmental test, it would not be possible to know immediately whether the device under test or some other component failed, as described above. Thus, after a test is performed, whether the test is successfully completed or not, the components used in the test are often discarded. This can increase tremendously the hardware costs of environmental testing, especially when multiple tests are performed.

Other disadvantages of the prior art include the inconvenience and expense of the test chambers themselves. Many such chambers may be used for conducting tests in parallel, and there is a cost associated with acquiring and maintaining the chambers as well as with providing the space needed to use and store the chambers. Also, the configurations of some test chambers make it difficult to set up the test. For example, test personnel may find it difficult to wire monitors and probes to the device being tested once the device has been placed inside the test chamber.

Thus, what is needed is a test apparatus and/or method that can address the problems summarized above. The present invention provides a novel solution to these problems.

SUMMARY OF THE INVENTION

Embodiments of the present invention pertain to an apparatus for environmental testing of a device under test (DUT), such as a printed circuit board. The apparatus generally includes a chamber for environmentally isolating the DUT with the DUT in situ and functional on another device (e.g., a motherboard). The DUT can be subjected to an environmental test condition (e.g., a prescribed maximum or minimum temperature) inside the chamber while the other device is isolated from the environmental test condition. The chamber may have a connector for coupling the other device and the DUT, such that the DUT and the other device are in communication although in isolated environments.

In one embodiment, a regulating assembly for producing the environmental test condition is coupled to the chamber. In one such embodiment, the regulating assembly is automatically powered off when the environmental test condition meets a threshold.

In one embodiment, a processor is coupled to the regulating assembly. The processor can control the regulating assembly to effect the environmental test condition. In another embodiment, a redundant controller is coupled to the regulating assembly. The redundant controller also can control the regulating assembly to effect the environmental test condition.

In yet another embodiment, a display monitor is used for displaying information pertaining to the environmental testing. In one such embodiment, the display monitor is coupled to the DUT (e.g., to the printed circuit board). In another such embodiment, the display monitor is coupled to the other device (e.g., to the motherboard).

In one embodiment, the chamber is configured to manage condensation within the chamber (e.g., to keep condensation from accumulating and/or from making contact with the DUT).

In summary, embodiments of the present invention provide a test apparatus, and method thereof, that allow the DUT (e.g., a printed circuit board) to be environmentally tested while in place on another device (e.g., a motherboard), but with the other device (e.g., the motherboard) isolated from the test environment. Thus, should there be a failure during testing, the device under test can be quickly identified as the likely failure point. In addition, other devices used in the testing can be used in subsequent tests. This not only reduces the costs associated with testing, but also enhances the repeatability of test results by reducing the number of new variables introduced from test to test. Furthermore, by virtue of its reduced size relative to conventional test chambers, a test apparatus in accordance with the embodiments of the present invention is expected to be more convenient and less expensive to use.

These and other objects and advantages of the various embodiments of the present invention will become recognized by those of ordinary skill in the art after having read the following detailed description of the embodiments that are illustrated in the various drawing figures.

BRIEF DESCRIPTION OF THE DRAWINGS

The accompanying drawings, which are incorporated in and form a part of this specification, illustrate embodiments of the present invention and, together with the description, serve to explain the principles of the invention.

DETAILED DESCRIPTION OF THE INVENTION

Reference will now be made in detail to the various embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be understood that the present invention may be practiced without these specific details. In other instances, well-known methods, procedures, components, and circuits have not been described in detail so as not to unnecessarily obscure aspects of the present invention.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, fragments, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "monitoring," "controlling," "powering off," "providing" or the like, refer to actions and processes (e.g., flowchart 500 of FIG. 5) of a computer system or similar electronic computing device. The computer system or similar electronic computing device manipulates and transforms data represented as physical (electronic) quantities within the computer system memories, registers or other such information storage, transmission or display devices. The present invention is well suited to use with other computer systems.

Figure 1A:
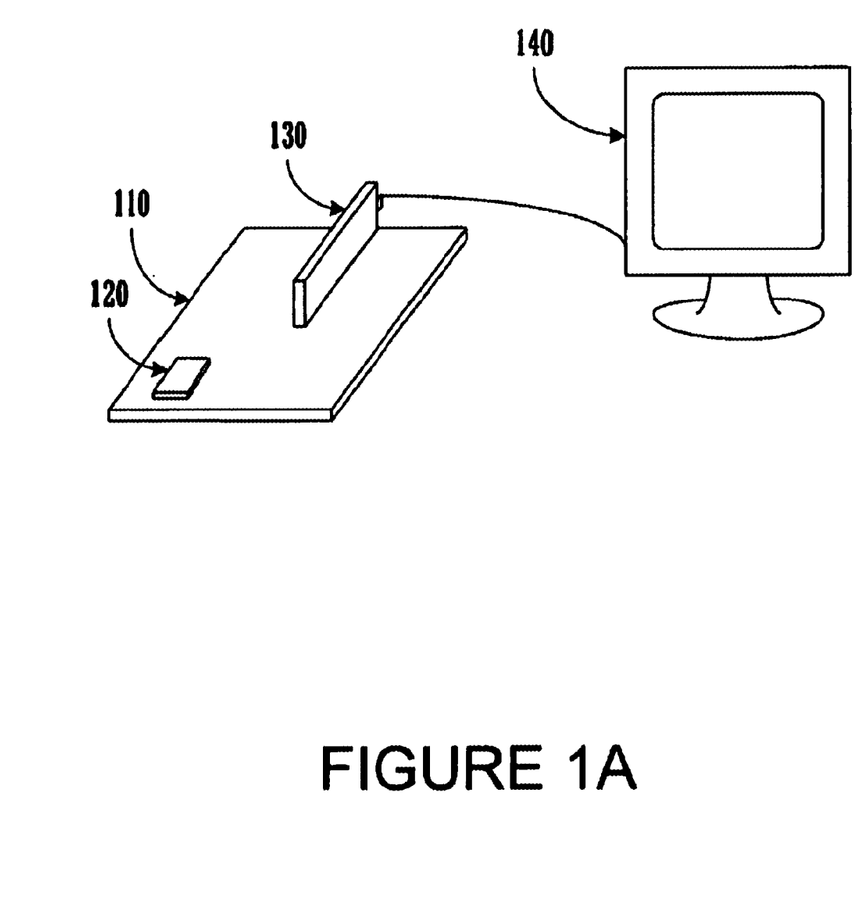
FIG. 1A is a perspective illustration of a printed circuit board coupled to a motherboard according to one embodiment of the present invention.

FIG. 1A is a perspective illustration of a printed circuit board (PCB) 130 coupled to a motherboard 110 according to one embodiment of the present invention. In this embodiment, printed circuit board 130 is coupled to motherboard 110 along its longer side, which is the typical case. However, as will be seen, the features described according to the various embodiments of the present invention may be adapted for use with a printed circuit board coupled to a motherboard in some other manner. Further information regarding the coupling of printed circuit board 130 to motherboard 110 is provided in conjunction with FIG. 2, below.

Printed circuit board 130 may be video card, sound card, network interface card, modem card, or other such device that may be coupled to motherboard 110. As a video card, printed circuit board 130 may be a Peripheral Component Interconnect (PCI) card or an Accelerated Graphics Port (AGP) card, for instance.

Also coupled to motherboard 110 in the present embodiment are a processor 120 and a display device 140. Display device 140 may be coupled to motherboard 110 via printed circuit board 130 when printed circuit board 130 is a video card; otherwise, display device 140 may be coupled to a video port on motherboard 110. It is appreciated that other components and devices may be coupled to motherboard 110. For example, a memory unit may be coupled to motherboard 110.

Figure 1B:
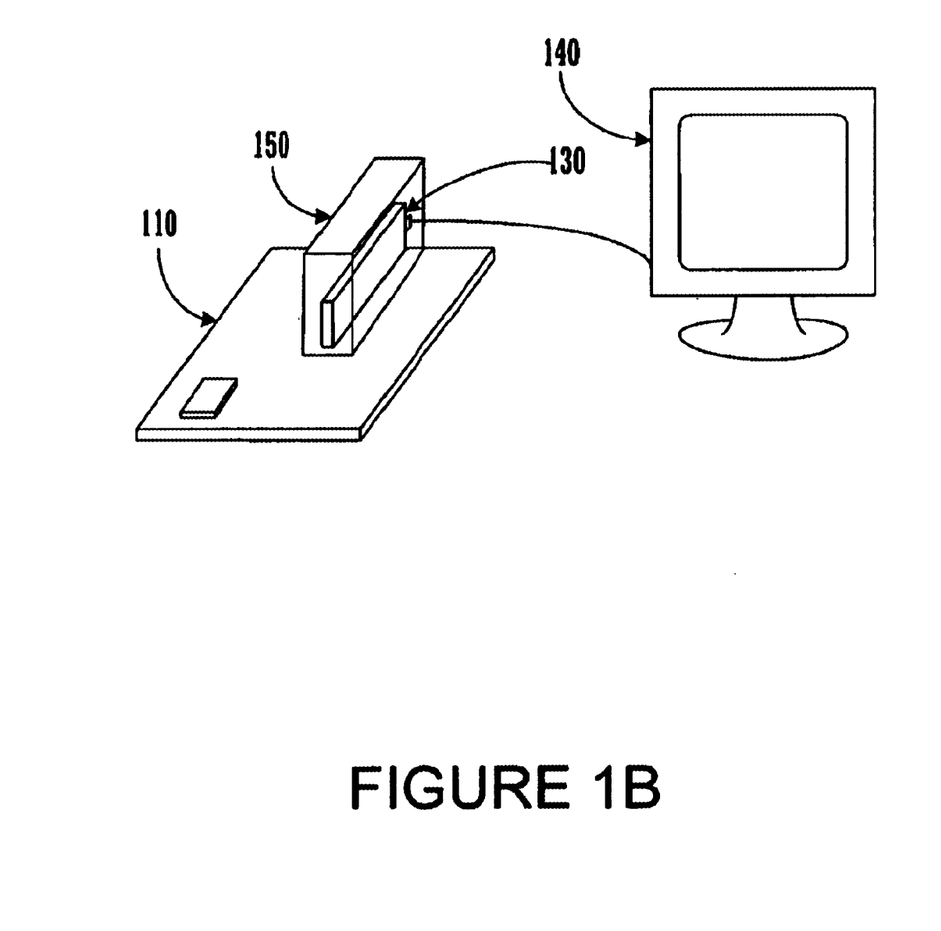
FIG. 1B is a perspective illustration of an environmental test apparatus positioned on a motherboard according to one embodiment of the present invention.

FIG. 1B is a perspective illustration showing an environmental test chamber 150 in place on motherboard 110 according to one embodiment of the present invention (for illustration only, test chamber 150 is shown as being transparent although this might not be the case). According to the present embodiment, test chamber 150 encloses printed circuit board 130 to separate the environment surrounding printed circuit board 130 from motherboard 110; however, as will be seen by FIG. 2, printed circuit board 130 remains coupled to and in communication with motherboard 110. Thus, printed circuit board 130 can be subjected to an environment (e.g., a test environment) that is different from the environment of motherboard 110, even though printed circuit board 130 is in situ (e.g., in its normal functional position) on motherboard 110.

It is appreciated that these features of the present invention are not limited to environmental testing of a printed circuit board installed on a motherboard, and that embodiments of the present invention may be utilized with other devices or in other applications. For example, certain features of the present invention may be utilized when it is desirable, during normal operation, to operate one device in one environment and another device in another environment. As another example, certain features of the present invention may be utilized when it is desirable to environmentally isolate processor 120 from motherboard 110 for either testing or normal operation. The same may be said for other computer system components in proximity to or adjoining each other. Likewise, there may be applications outside of the realm of computer systems in which the general features of the present invention, in its various embodiments, may be utilized. In general, the embodiments of the present invention provide an apparatus that allows one device to be environmentally isolated from another device, although the devices are in communication.

As mentioned, in one embodiment, printed circuit board 130 may be a video card. In that embodiment, printed circuit board 130 and motherboard 110 operate together to perform a function; namely, to generate a display on display device 140. Thus, taking the preceding discussion another step further, the embodiments of the present invention provide an apparatus that allows one device to be environmentally isolated from another device, although the devices are in communication and together perform a function.

Figure 2:
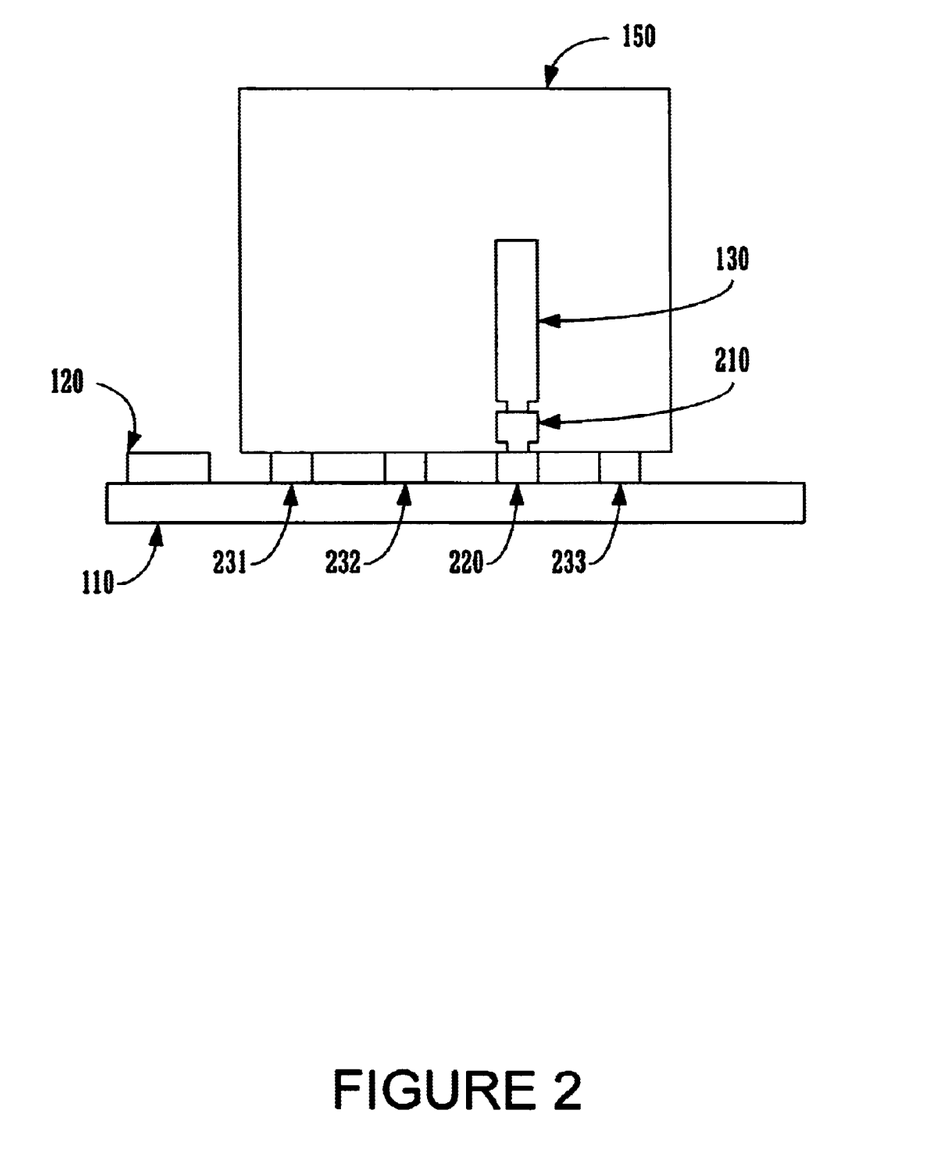
FIG. 2 is a cross-sectional side view illustrating a chamber for isolating a device under test according to one embodiment of the present invention.

FIG. 2 is a cross-sectional side view illustrating an exemplary test chamber 150 for isolating a device under test (e.g., printed circuit board 130) according to one embodiment of the present invention. Typically, a motherboard will have a number of slots (e.g., AGP and/or PCI slots), each slot for receiving a printed circuit board in a known fashion. In the present embodiment, motherboard 110 includes slots 220, 231, 232 and 233. In this embodiment, the weight of test chamber 150 rests on slots 231, 232 and 233; conversely, these slots support the weight of test chamber 150 and also provide stability to test chamber 150.

In the present embodiment, test chamber 150 incorporates a connector or extender 210. Connector 210 may also be referred to as a wear-out connector. Connector 210 is incorporated into test chamber 150 in a way that maintains the integrity and functionality of the test chamber; that is, test chamber 150 including connector 210 can be used to environmentally isolate one device from another device. Using connector 210, printed circuit board 130 can be coupled to slot 220 on motherboard 110. In the present embodiment, printed circuit board 130 is inserted into connector 210 and connector 210 is inserted into slot 220. Printed circuit board 130 and motherboard 110 can then communicate in an otherwise conventional manner.

Generally speaking, connector 210 is compatible with slot 220. For example, if slot 220 is an AGP slot, then connector 210 is an AGP connector, and if slot 220 is a PCI slot, then connector 210 is a PCI port, etc. Connector 210 may also be a standard bus connector for a personal computer system.

Figure 3:
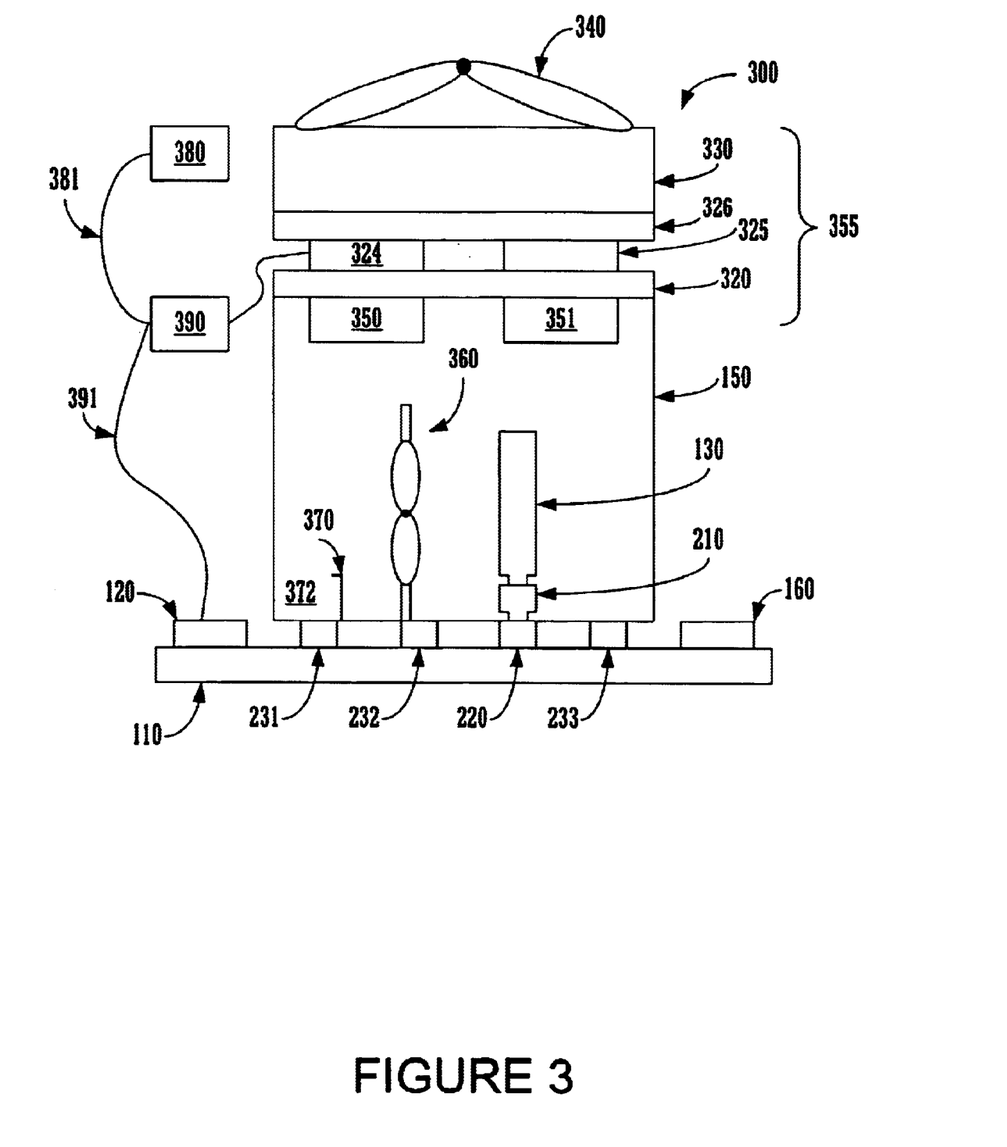
FIG. 3 is a cross-sectional side view of an environmental test apparatus according to one embodiment of the present invention.

FIG. 3 is a cross-sectional side view showing details of an environmental test apparatus 300 according to one embodiment of the present invention. In the present embodiment, test apparatus 300 generally includes a test chamber 150 and a regulating assembly 355. Test chamber 150 is generally an insulated chamber; the type of insulating material used is a design choice and any number of well known materials may be used. In the present embodiment, a regulating assembly 355 forms one of the walls of test chamber 150 (e.g., the top surface, "top" being a relative term). In one embodiment, regulating assembly 355 can be separated from the remainder of test chamber 150, allowing ready access to the inside of test chamber 150. In one such embodiment, when regulating assembly 355 is separated from test chamber 150, the regulating assembly 355 is automatically powered off.

Regulating assembly 355 is used to produce and maintain the desired environment within test chamber 150. Accordingly, a device under test (e.g., printed circuit board 130) placed or installed inside the test chamber 150 will be subjected to a specified environmental test condition, while devices outside the test chamber 150 (e.g., motherboard 110 including processor 120) will remain at an ambient condition. In various embodiments, the environmental test condition may be associated with temperature (including the rate of temperature change as well as temperature extremes), humidity, radiation, or chemical conditions.

In one embodiment, test apparatus 300 is used to heat or cool the test chamber 150 to a specified temperature. In this embodiment, regulating assembly 355 includes internal heat sinks 350 and 351, a first copper plate 320, heat pumps 324 and 325, a second copper plate 326, an external heat sink 330, and a fan 340. In one embodiment, heat pumps 324 and 325 are thermoelectric modules, which are essentially solid state heat pumps that are known in the art. When supplied with a current in one direction, the thermoelectric modules can be used to remove heat from test chamber 150; when the current is reversed, the thermoelectric modules add heat to test chamber 150. Thermoelectric modules may also be referred to as thermoelectric coolers or controllers.

It is appreciated that, in alternate embodiments, regulating assembly 355 may include a number of elements different than those just described. For example, although two thermoelectric modules are shown, more than two such modules may actually be used. It is also appreciated that materials different from those just mentioned may be used. Furthermore, elements different from those just described, but that accomplish the same functionality, may instead be used. For example, a mechanism other than thermoelectric modules may be used to heat up and cool down test chamber 150. Also, one element may be used to heat up the test chamber 150, and another element may be used to cool down the test chamber 150. In addition, regulating assembly 355 may include elements not shown. For example, thermocouples may be used to monitor temperature and to provide feedback information to power regulator 390, processor 120 and/or redundant controller 380.

In the present embodiment, test chamber 150 includes a fan assembly 360 for circulating air within test chamber 150. Fan assembly 360 can also function to move any condensation that may occur (e.g., during cooling) away from the device under test (e.g., printed circuit board 130). In one embodiment, condensation is collected in a plenum 372 formed by weir 370, from where it can be periodically or continuously drained.

In the present embodiment, regulating assembly 355 is coupled to a power regulator 390. In this embodiment, power regulator 390 is coupled to processor 120 by connecting cable 391. Processor 120, among other functions, can function to control power regulator 390. In the present embodiment, a redundant controller 380 is also coupled to power regulator 390 by connecting cable 381. In one embodiment, redundant controller 380 is a panel meter. It is appreciated that, in an alternate embodiment, only a single controller (e.g., processor 120 or redundant controller 380) may be used.

In the present embodiment, either processor 120 or redundant controller 380 provide the capability to independently control the test environment; should one of these controllers become unavailable for some reason, the other can take over. By appropriately sizing the resistances of connecting cables 381 and 391, or by using some other known mechanism, one of the controllers will override the other.

As suggested by FIG. 1B, the environmental test apparatus 300 of FIG. 3 can be coupled to a display monitor 140. In the embodiment in which printed circuit board 130 is a video card, the display monitor 140 can be coupled to the device under test (to printed circuit board 130). As mentioned above, a memory unit (e.g., memory 160) may be coupled to motherboard 110. Thus, in one embodiment, test apparatus 300, motherboard 110, processor 120, printed circuit board 130, display monitor 140, and memory 160 provide a combined unit that can monitor and control the environmental testing, conduct benchmark and diagnostic test procedures, record test results that include information that characterizes the capability of the device under test to function in the test environment, and display the test conditions and results in real time. In other words, according to the present embodiment, these components provide an apparatus for conducting the environmental testing that includes the device under test as one element of the test apparatus.

With reference to FIG. 3, test apparatus 300 is described in practice for an embodiment in which the device under test is a video card. As such, the device under test can be coupled to display monitor 140 (FIG. 1B). Accordingly, should the device under test cease to function, the failure will be readily apparent as there will no longer be a display on display monitor 140. While this provides some advantage, it is appreciated that this feature is not an essential element of an environmental qualification test. It is also appreciated that, even if the device under test is not a video card, a display capability may still be provided.

Continuing with reference to FIG. 3, the use of test apparatus 300 is described for an example in which the device under test (printed circuit board 130) is to be subjected to a minimum temperature condition. In one embodiment, power regulator 390 receives control signals from processor 120. This may be accomplished using conventional software/firmware/hardware. Heat pumps 324 and 325 coupled to power regulator 390, in combination with the other components of regulating assembly 355, function to draw heat from test chamber 150. Fan assembly 360 circulates air within test chamber 150 while directing condensation from printed circuit board 130. The temperature inside the test chamber 150 is monitored and may be displayed on display monitor 140. Other information of interest may be similarly displayed. According to the various embodiments of the present invention, conventional monitoring and display software can be used. Such software may be stored in memory 160 and executed by processor 120. It is appreciated that information may also be displayed using redundant controller 380 (e.g., a panel meter having a display capability).

Continuing with the example, when the specified minimum temperature condition is reached, the regulating assembly 355 is automatically powered off. This may be accomplished under the control of processor 120 and/or redundant controller 380. Alternatively, power regulator 390 may operate directly under the control of thermocouples or other temperature-sensing devices located within test chamber 150. Generally speaking, according to the various embodiments of the present invention, when a threshold condition is reached, the regulating assembly 355 ceases to function. Regulating assembly 355 will automatically resume functioning to maintain the desired test condition.

With the test condition reached, functional, diagnostic and benchmark testing of printed circuit board 130 can be initiated. According to the various embodiments of the present invention, conventional software available for such testing can be used. Such software may be stored in memory 160 and executed by processor 120. Test results can be displayed in real time on display monitor 140 and also recorded, perhaps using memory 160.

An embodiment of the present invention has just been described in which processor 120 and memory 160 function with motherboard 110 and printed circuit board 130, along with test apparatus 300, to perform the environmental testing. However, it is appreciated that the functionality provided by processor 120 (as well as redundant controller 380) and/or memory 160 may instead be provided by remote (peripheral) devices. For example, instead of performing the environmental testing under the local control of processor 120 (or redundant controller 380), the testing may be remotely controlled by another computer system communicatively coupled to the test apparatus 300. Similarly, test results can be recorded by a memory unit residing on a remote computer system.

Figure 4:
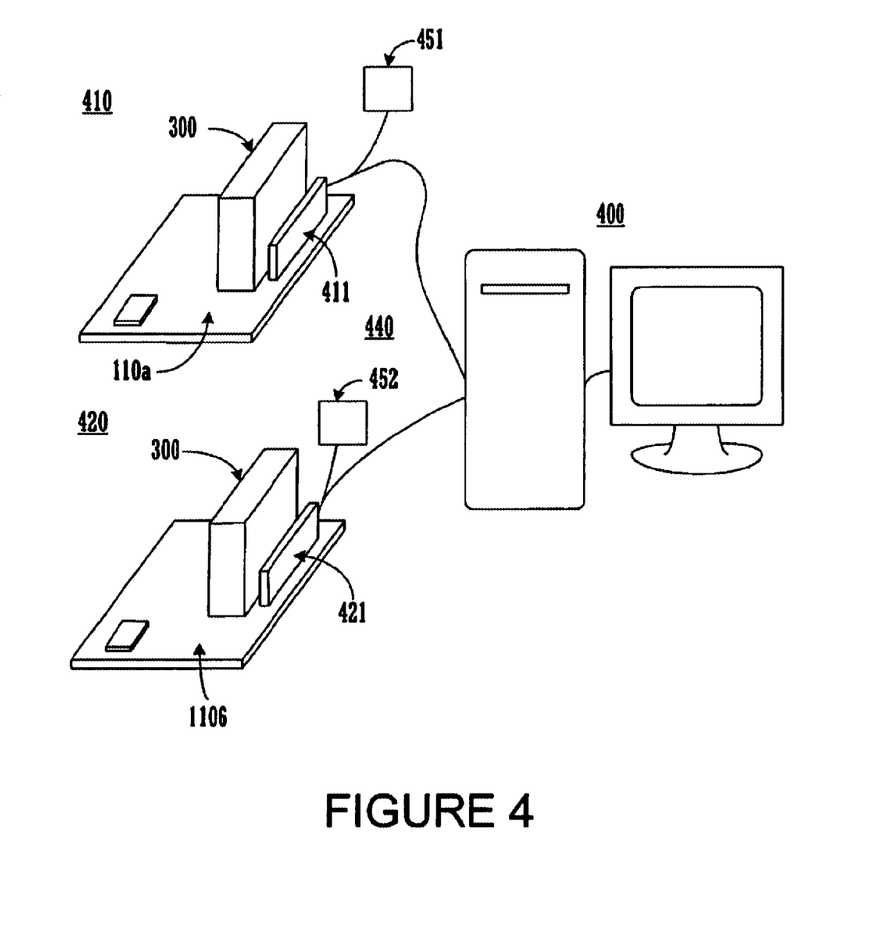
FIG. 4 illustrates environmental testing apparatuses coupled in a network according to one embodiment of the present invention.

FIG. 4 illustrates environmental test systems 410 and 420 coupled in a network 440 according to one embodiment of the present invention. For example, in one embodiment, network interface cards 411 and 412 are coupled to motherboards 110a and 110b, respectively, allowing communication between systems 410 and 420 and a remote (or centralized) computer system 400. In this embodiment, computer system 400 can be used to control multiple tests and test systems from a remote or centralized location. In one embodiment, local control of each test system can also be provided by redundant controllers 451 and 452, respectively.

Figure 5:
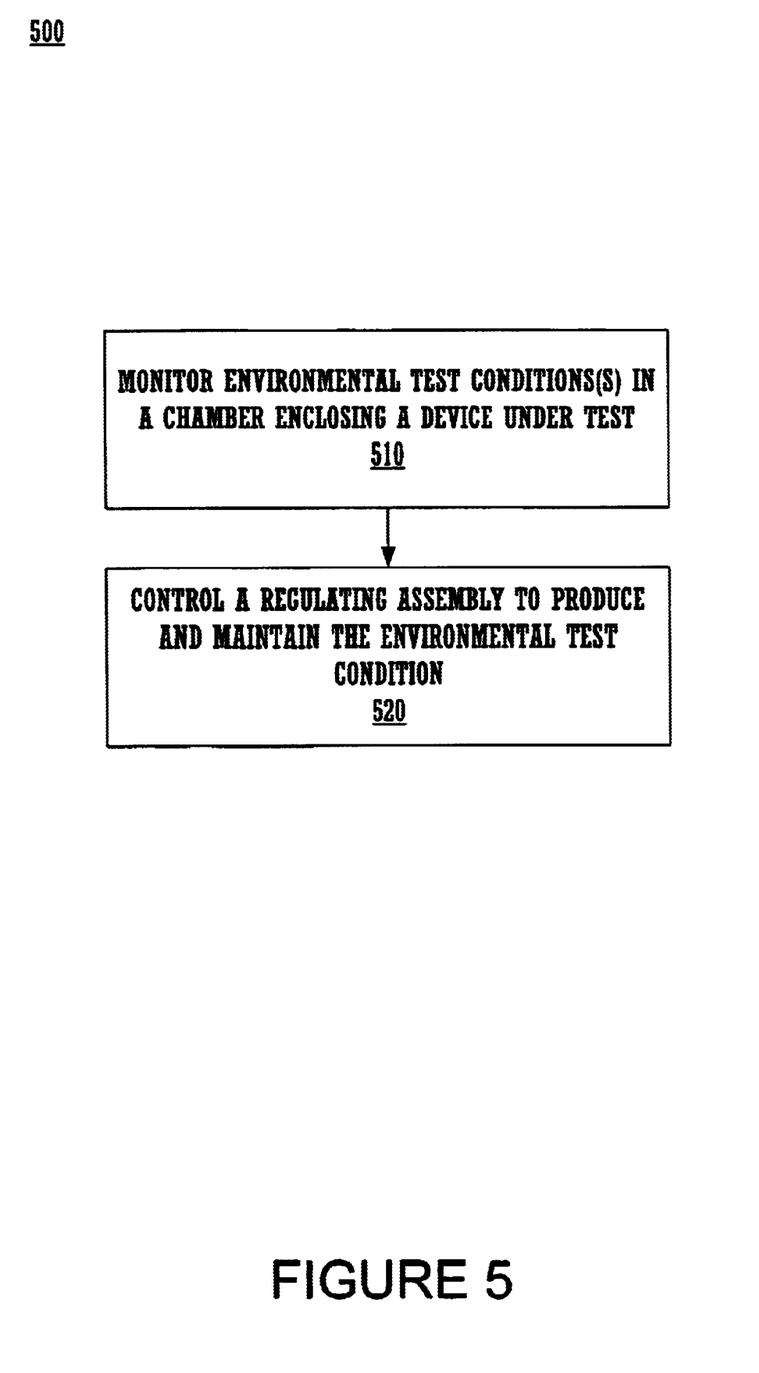
FIG. 5 is a flowchart of a method for environmentally testing a device according to one embodiment of the present invention.

FIG. 5 is a flowchart of a method for environmentally testing a device according to one embodiment of the present invention. Although specific steps are disclosed in flowchart 500, such steps are exemplary. That is, the present invention is well suited to performing various other steps or variations of the steps recited in flowchart 500. It is appreciated that the steps in flowchart 500 may be performed in an order different than presented and that the steps in flowchart 500 are not necessarily performed in the sequence illustrated. In general, steps 510 and 520 of flowchart 500 are performed substantially at the same time, although they may be performed at different times.

In step 510, in the present embodiment, an environmental test condition produced in a chamber enclosing a device under test is monitored. In this embodiment, the device under test is in position and functional on another device, although the chamber environmentally isolates the other device from the device under test.

In one embodiment, with reference to FIG. 3, the device under test is a printed circuit board 130 while the other device is a motherboard 110. In this embodiment, the printed circuit board 130 is disposed within test apparatus 300 (specifically, within test chamber 150) and coupled to motherboard 110 by an intervening connector 210.

In step 520 of FIG. 5, in the present embodiment, the environmental test condition is produced and maintained using a regulating assembly coupled to the test chamber. In one embodiment, the regulating assembly is automatically powered on and off to maintain a specified test condition.

In one embodiment, with reference to FIG. 3, the environmental test condition is produced and maintained using regulating assembly 355 coupled to test chamber 150. In one such embodiment, regulating assembly 355 is under the control of motherboard 110 (specifically, processor 120 coupled to motherboard 110).

In summary, embodiments of the present invention provide a test apparatus, and method thereof, that allow a device under test (e.g., a printed circuit board) to be environmentally tested while in place on another device (e.g., a motherboard), but with the other device (e.g., the motherboard) isolated from the test environment. Thus, should there be a failure during testing, the device under test can be quickly identified as the likely failure point. In addition, other devices used in the testing can be used in subsequent tests. This not only reduces the costs associated with testing, but also enhances the repeatability of test results by reducing the number of new variables introduced from test to test. Furthermore, by virtue of its reduced size relative to conventional test chambers, a test apparatus in accordance with the embodiments of the present invention is expected to be more convenient and less expensive to use. Overall, testing throughput is expected to increase but with less costs.

Embodiments of the present invention, an apparatus for environmental testing of a device in situ (and method thereof), are thus described. While the present invention has been described in particular embodiments, it should be appreciated that the present invention should not be construed as limited by such embodiments, but rather construed according to the below claims.

What is claimed is:

1. An apparatus for environmental testing of a device under test (DUT), the apparatus comprising:
   a chamber for environmentally isolating said DUT with said DUT in situ in a computer system that comprises another device, said DUT functional on said other device, wherein said DUT is subjected to an environmental test condition inside said chamber and wherein said other device is isolated from said environmental test condition; and
   said chamber comprising a connector for coupling said other device and said DUT, wherein said DUT is coupled to said connector inside said chamber and wherein said other device is coupled to said connector outside said chamber such that said DUT and said other device are in communication although in isolated environments.

2. The apparatus of claim 1 wherein said DUT comprises a printed circuit board and said other device is a motherboard.

3. The apparatus of claim 2 wherein said DUT comprises a graphics card.

4. The apparatus of claim 2 further comprising:
   a regulating assembly coupled to said chamber, said regulating assembly operable for producing said environmental test condition;
   a processor located on said motherboard, said processor operable for controlling said regulating assembly to effect said environmental test condition; and
   a redundant controller coupled to said regulating assembly, said redundant controller also operable for controlling said regulating assembly to effect said environmental test condition.

5. The apparatus of claim 1 wherein said connector is an Accelerated Graphics Port.

6. The apparatus of claim 1 wherein said connector is a standard bus connector for a personal computer system.

7. The apparatus of claim 1 further comprising a regulating assembly coupled to said chamber, said regulating assembly operable for producing said environmental test condition.

8. The apparatus of claim 7 wherein said regulating assembly is automatically powered off when said environmental test condition meets a threshold.

9. The apparatus of claim 7 further comprising a processor coupled to said regulating assembly, said processor operable for controlling said regulating assembly to effect said environmental test condition.

10. The apparatus of claim 9 further comprising a redundant controller coupled to regulating assembly, said redundant controller also operable for controlling said regulating assembly to effect said environmental test condition.

11. The apparatus of claim 1 further comprising a display monitor coupled to said other device and operable for displaying information pertaining to said environmental testing.

12. The apparatus of claim 1 further comprising a display monitor coupled to said DUT and operable for displaying information pertaining to said environmental testing.

13. The apparatus of claim 1 wherein said environmental test condition corresponds to a temperature inside said chamber.

14. The apparatus of claim 1 wherein said chamber is configured to manage condensation within said chamber.

15. The apparatus of claim 14 wherein said chamber comprises a fan.

16. An apparatus for environmentally testing a printed circuit board, the apparatus comprising:
   a housing that isolates a single said printed circuit board in a test environment with said printed circuit board in situ in a computer system, said housing also for separating a motherboard coupled to said printed circuit board from said test environment;
   a regulating assembly coupled to said housing, said regulating assembly for producing and maintaining said test environment; and
   a connector passing through a surface of said housing, wherein said printed circuit board and said motherboard are coupled to different ends of said connector.

17. The apparatus of claim 16 wherein said regulating assembly comprises a heat pump.

18. The apparatus of claim 16 wherein said motherboard and said printed circuit board communicate to perform a function with said printed circuit board subjected to said test environment and said motherboard isolated from said test environment.

19. The apparatus of claim 18 wherein a processor coupled to said motherboard controls said function, said processor controlled via a computer system network.

20. The apparatus of claim 18 further comprising a display monitor coupled to said printed circuit board, wherein said function comprises generating a display using said display monitor.

21. The apparatus of claim 16 wherein said regulating assembly is automatically powered off when said test environment reaches a specified temperature.

22. The apparatus of claim 16 wherein said regulating assembly is automatically powered off when said regulating assembly is decoupled from said housing.

23. The apparatus of claim 16 further comprising a processor coupled to said regulating assembly, said processor operable for controlling said regulating assembly to produce and maintain said test environment.

24. The apparatus of claim 23 further comprising a redundant controller coupled to regulating assembly, said redundant controller also operable for controlling said regulating assembly to produce and maintain said test environment.

25. A method of environmentally testing a device under test (DUT), said method comprising:

monitoring an environmental test condition produced in a chamber isolating a single said DUT, wherein said DUT is in position and functional on another device and wherein said chamber environmentally isolates said other device from said environmental test condition; and controlling a regulating assembly coupled to said chamber to produce and maintain said environmental test condition.

26. The method of claim 25 wherein said chamber comprises a connector, wherein said DUT is connected directly to said connector inside said chamber and wherein said other device is connected directly to said connector outside said chamber.

27. The method of claim 26 wherein said DUT comprises a single printed circuit board and said other device is a motherboard.

28. The method of claim 25 further comprising:

powering off said regulating assembly when said environmental test condition meets a threshold.

29. The method of claim 25 further comprising:

powering off said regulating assembly when said regulating assembly is decoupled from said chamber.

30. The method of claim 25 wherein said monitoring and controlling are performed using said other device.

31. The method of claim 25 further comprising:

providing information pertaining to said environmental testing to a display device for display, wherein a display on said display device is generated using said DUT, wherein failure of said DUT causes loss of said display.

32. The method of claim 25 further comprising:

providing information pertaining to said environmental testing to a display device for display, wherein said display device is coupled to said other device.

33. The method of claim 25 wherein said environmental test condition corresponds to a temperature inside said chamber.

34. The method of claim 25 further comprising:

identifying a failure during said environmental testing, wherein said DUT is identified as the point of said failure due to its isolation in said chamber.

* * * * *